(12) United States Patent
Chen et al.

(10) Patent No.: US 6,501,164 B1
(45) Date of Patent: Dec. 31, 2002

(54) MULTI-CHIP SEMICONDUCTOR PACKAGE WITH HEAT DISSIPATING STRUCTURE

(75) Inventors: Ying-Chieh Chen, Taichung (TW); Jeng-Yuan Lai, Taichung (TW); Jzu-Yi Tien, Taichung (TW); Chiung-Kai Yang, Tainan (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 10/026,599

(22) Filed: Dec. 20, 2001

(30) Foreign Application Priority Data

Jun. 26, 2001 (TW) .......................................... 90115372

(51) Int. Cl.[7] .......................... H01L 23/48; H01L 23/52; H01L 29/40; H01L 23/04

(52) U.S. Cl. ........................ 257/686; 257/779; 257/783; 257/786

(58) Field of Search ................................. 257/779, 698, 257/783, 786, 686

(56) References Cited

U.S. PATENT DOCUMENTS

| 5,397,921 A | | 3/1995 | Karnezos | 257/779 |
|---|---|---|---|---|
| 6,150,724 A | * | 11/2000 | Wenzel et al. | 257/724 |
| 2002/0096753 A1 | * | 7/2002 | Tu et al. | 257/680 |

* cited by examiner

*Primary Examiner*—David E. Graybill
(74) *Attorney, Agent, or Firm*—Peter F. Corless; Steven M. Jensen; Edwards & Angell, LLP

(57) ABSTRACT

A multi-chip semiconductor package with a heat dissipating structure is proposed, in which a chip receiving cavity and an opening respectively formed in the heat dissipating structure and a chip carrier, are used to accommodate semiconductor chips therein with the chips being in direct contact with the heat dissipating structure, allowing heat generated by the chips to be rapidly dissipated through the heat dissipating structure. With the provision of through holes for interconnecting the chip receiving cavity and opening, gold wires pass the through holes and electrically connect the chips to the chip carrier. Such a structure with chips embedded in the chip receiving cavity and opening makes internal elements to be more compactly arranged in the semiconductor package, which is preferable in response to profile miniaturization of electronic product development.

12 Claims, 7 Drawing Sheets

MULTI-CHIP SEMICONDUCTOR PACKAGE WITH HEAT DISSIPATING STRUCTURE

FIELD OF THE INVENTION

The present invention relates to semiconductor packages, and more particularly, to a multi-chip semiconductor package with a heat dissipating structure having a chip receiving cavity, so as to improve overall heat dissipating efficiency and miniaturize the profile of the semiconductor package.

BACKGROUND OF THE INVENTION

With the continuing development of the packaging technology, semiconductor devices become available with various forms of packages. In particular, BGA (ball grid array) semiconductor packages having high density of input/output (I/O) connections and the self-alignment function become a main stream of products suitably to be used in electronic devices due to preferable characteristics of high memory capacity, high processing speed and low profile in appearance.

In order to achieve high functionality and performances of electronic products, besides the foregoing preferably characteristics of the BGA semiconductor packages for use in the electronic products, it is greatly critical to increase the layout density of semiconductor devices on a main board or to enhance the circuit integration of semiconductor chips encapsulated in the semiconductor devices. However, since the increased layout of the semiconductor devices leads to enlargement in usage area of the main board, it is not favorable in response to a low profile trend of electronic product development. As for the integration enhancement of the semiconductor chips, it may be restricted in extent by the current technology, and also undesirably causes increase in packaging costs. Therefore, an effective solution is to mount two or more chips in a single packaging device with multiply provision of integrated circuit density, memory capacity and processing speed.

A conventional stacked-chip or multi-chip-module (MCM) semiconductor package is made by firstly mounting multiple chips on a chip carrier and subsequently performing an encapsulating process. FIGS. 1A and 1B illustrate cross-sectional views of the stacked-chip semiconductor package and the multi-chip-module semiconductor package, respectively. As shown in the drawings, the semiconductor package 1 includes a chip carrier 10 such as a substrate or a tape, for mounting a plurality of semiconductor chips 11 with different dimensions thereon; a plurality of conductive elements 12 such as gold wires or solder bumps for electrically connecting the chips 11 to the chip carrier 10; and an encapsulant 13 for encapsulating the chips 11. The stacked-chip or MCM semiconductor package 1 is therefore characterized in electrically bonding the chips 11 of different dimensions onto the chip carrier 10 in a stack or flip-chip manner to be subsequently encapsulated by the encapsulant 13. However, such a multi-chip semiconductor package 1 is dimensionally higher than normal, and occupies more area as mounted on an external printed circuit board; this is not ideal for the low profile development of electronic products.

In addition, a semiconductor package having multiple chips is also provided with high density of electronic elements and electronic circuits, and thus a large amount of heat would be generated in operation of the multi-chip semiconductor package. In this case, if the heat cannot be dissipated effectively and rapidly, it would seriously damage the functionality and lifetime of the chips. Therefore, a BGA package provided with a heat spreader is accordingly developed. U.S. Pat. No. 5,397,921 entitled "TAB GRID ARRAY" discloses a cavity down BGA semiconductor package for improving heat dissipating efficiency and electrical functions thereof. Referring to FIG. 2, such a semiconductor package 1' includes a substrate 10' formed at a central position with an opening 102 dimensionally larger than a semiconductor chip; a heat spreader 14 mounted on the substrate 10', and formed with a downwardly-opened chip receiving cavity 142 corresponding in position to the opening 102 of the substrate 10'; a semiconductor chip 11' accommodated in the chip receiving cavity 142; a plurality of conductive elements 12' for electrically connecting the chip 11' to the substrate 10'; a plurality of solder balls 15; and an encapsulant 13' for encapsulating the chip 11'. This semiconductor package 1' is different from a normal BGA package by disposing the chip 11' with its circuit surface (not shown) facing downwardly in the chip receiving cavity 142, and electrically connecting the circuit surface of the chip 11' directly to the substrate 10'. This significantly shortens the electrical transmitting distance from the chip 11' to the outermost solder balls 15, and thereby reduces the interference of electric inductance. The semiconductor package 1' is further advantageous of having good heat dissipating efficiency with the provision of the heat spreader 14 for rapidly dissipating heat produced by the chip 11' and efficiently cooling down the chip 11'.

However, the foregoing cavity down BGA package structure can only be incorporated with one semiconductor chip, which is not suitably applicable for a multi-chip semiconductor package. Therefore, it is tremendously desired to find out a solution for the heat dissipation problem of the multi-chip semiconductor package that is highly integrated with electronic circuits and electronic elements.

SUMMARY OF THE INVENTION

A primary objective of the present invention is to provide a multi-chip semiconductor package, in which a heat dissipating structure is formed with a chip receiving cavity for receiving at least one semiconductor chip therein so as to enhance heat dissipation efficiency.

Another objective of the invention is to provide a multi-chip semiconductor package for reducing overall dimensions of the fabricated packaging product.

A further objective of the invention is to provide a multi-chip semiconductor package, which can be made by current fabricating equipment without using the costly flip-chip technology.

In accordance with the foregoing and other objectives, the present invention proposes a multi-chip semiconductor package, comprising: a chip carrier having at least one opening for receiving a semiconductor chip therein; a heat dissipating structure formed with a chip receiving cavity corresponding in position above the opening of the chip carrier, and a plurality of through holes for interconnecting the chip receiving cavity and the opening of the chip carrier and for allowing gold wires and an encapsulating resin to pass through the through holes; a first and a second semiconductor chips attached to surfaces of the heat dissipating structure, and received in the chip receiving cavity and the opening of the chip carrier respectively; a plurality of gold wires for electrically connecting the chips to the chip carrier; and an encapsulant for encapsulating the chips and the gold wires.

Since the chips are respectively in direct contact with the heat dissipating structure, heat generated by the chips can be rapidly dissipated via the heat dissipating structure with the provision of the shortest heat transmitting pathway; this therefore significantly improves heat dissipating efficiency of the semiconductor package. Besides, compared to a conventional stacked-chip semiconductor structure, this invention with the chips being accommodated in the chip receiving cavity and the opening of the chip carrier, allows internal elements to be more compactly arranged in the semiconductor package, thereby making the packaging space optimally utilized. This is beneficially applicable to a multi-chip structure in favor of high memory capacity without undesirably increasing package dimensions, and is therefore preferable for low profile development of electronic products.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

First Preferred Embodiment

The following description is made with reference to FIGS. 3 and 4A to 4F for depicting a first preferred embodiment of a semiconductor package of the present invention. The drawings are made in simplicity with the only illustration of elements related to the invention, whereas practical semiconductor structure can be more complex in element number and layout.

Figure 1A:
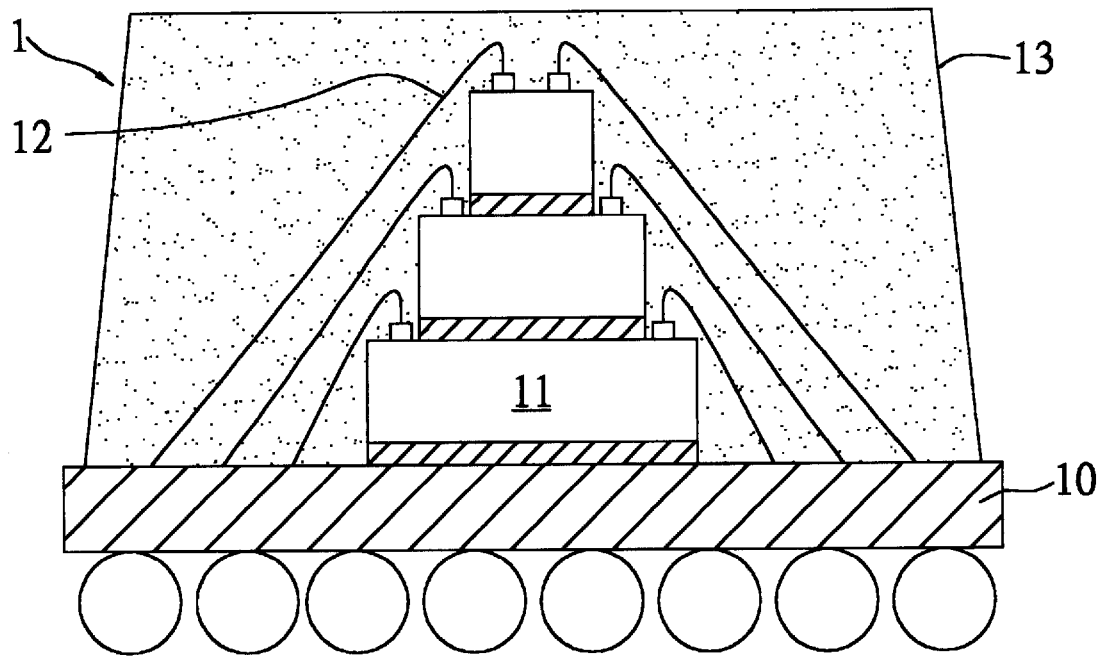
FIG. 1A (PRIOR ART) is a cross-sectional view of a conventional stacked-chip semiconductor package.
Figure 1B:
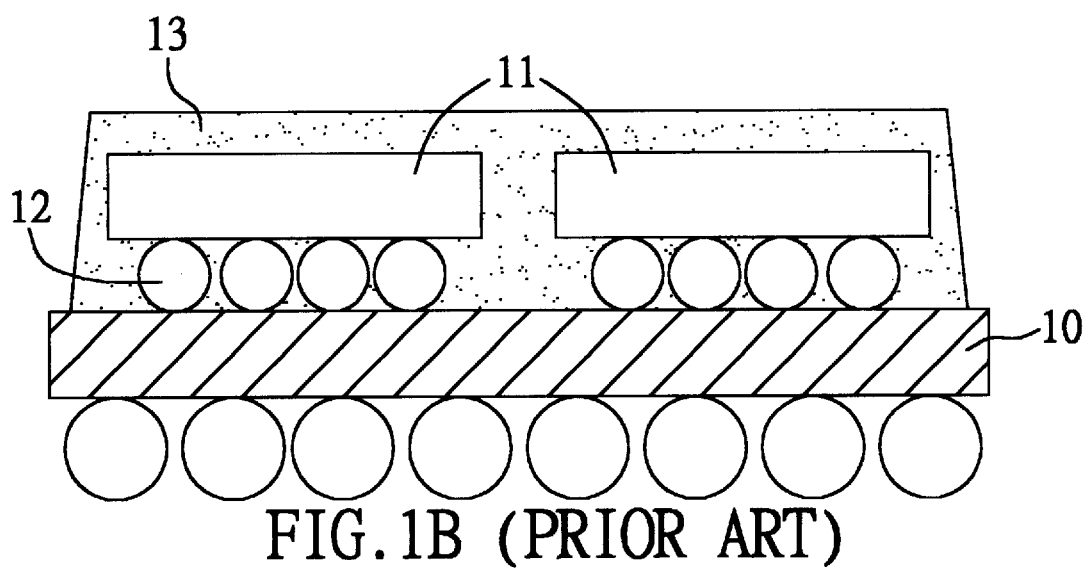
FIG. 1B (PRIOR ART) is a cross-sectional view of a conventional multi-chip-module semiconductor package.
Figure 2:
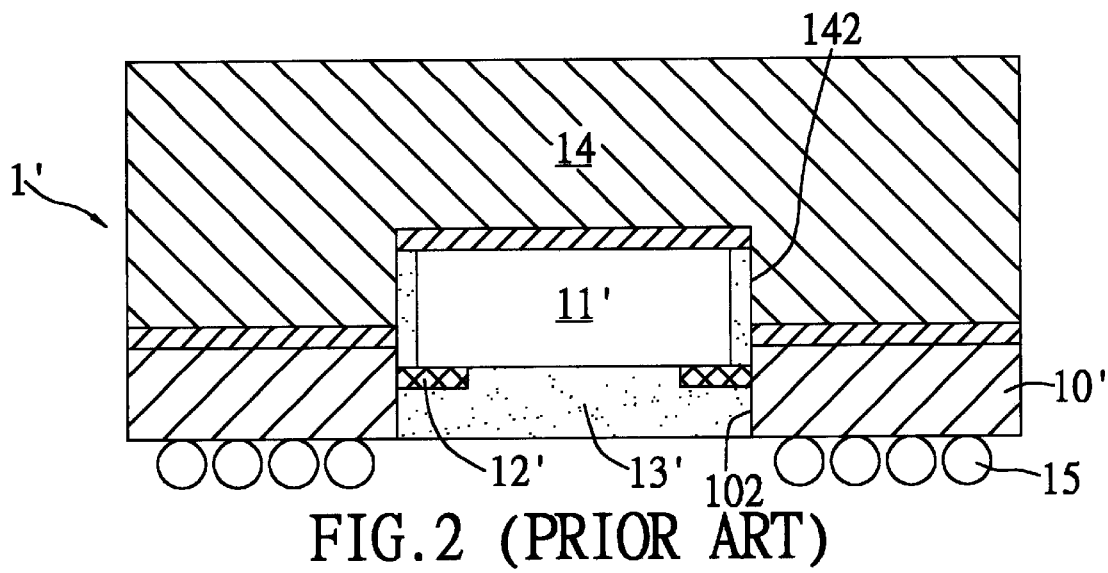
FIG. 2 (PRIOR ART) is a cross-sectional view of a cavity down BGA semiconductor package disclosed in U.S. Pat. No. 5,397,921.
Figure 3:
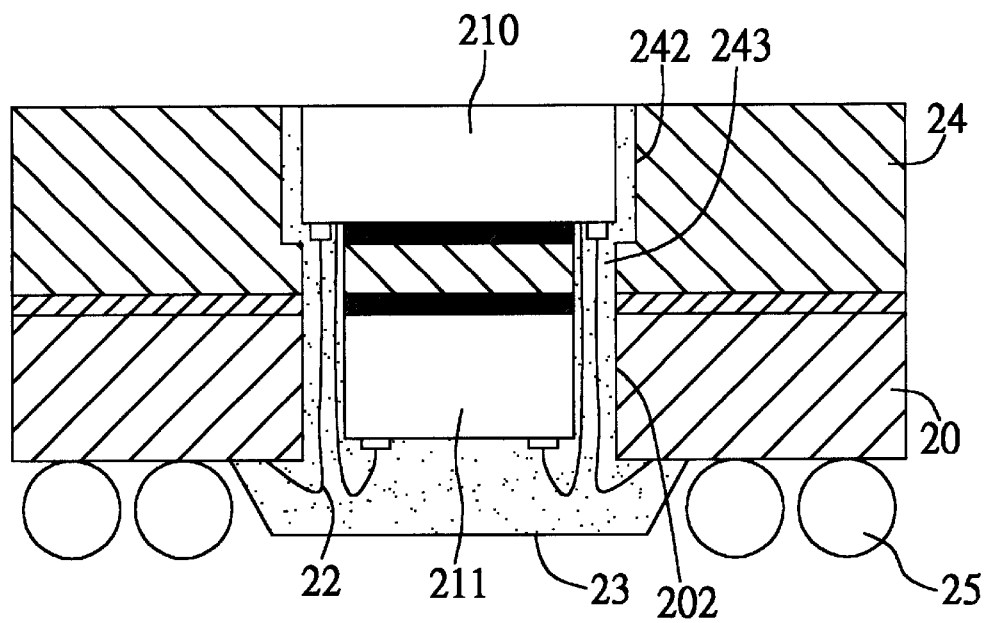
FIG. 3 is a cross-sectional view of a semiconductor package of a first preferred embodiment of the invention.

As shown in FIG. 3, the semiconductor package 2 of the first embodiment comprises a chip carrier 20 having an opening 202 for receiving semiconductor chips therein; a heat dissipating structure 24 formed with a chip receiving cavity 242, and disposed on the chip carrier 20 to cover the opening 202 of the chip carrier 20; a first and a second semiconductor chips 210, 211 received in the chip receiving cavity 242 and the opening 202, respectively; a plurality of gold wires 22 for electrically connecting the chips 210, 211 to the chip carrier 20; a plurality of solder balls 25; and an encapsulant 23 for encapsulating the chips 210, 211 and the gold wires 22.

Fabricating processes of the semiconductor package of the first embodiment of the invention are detailed in the following with reference to FIGS. 4A to 4E.

Figure 4A:
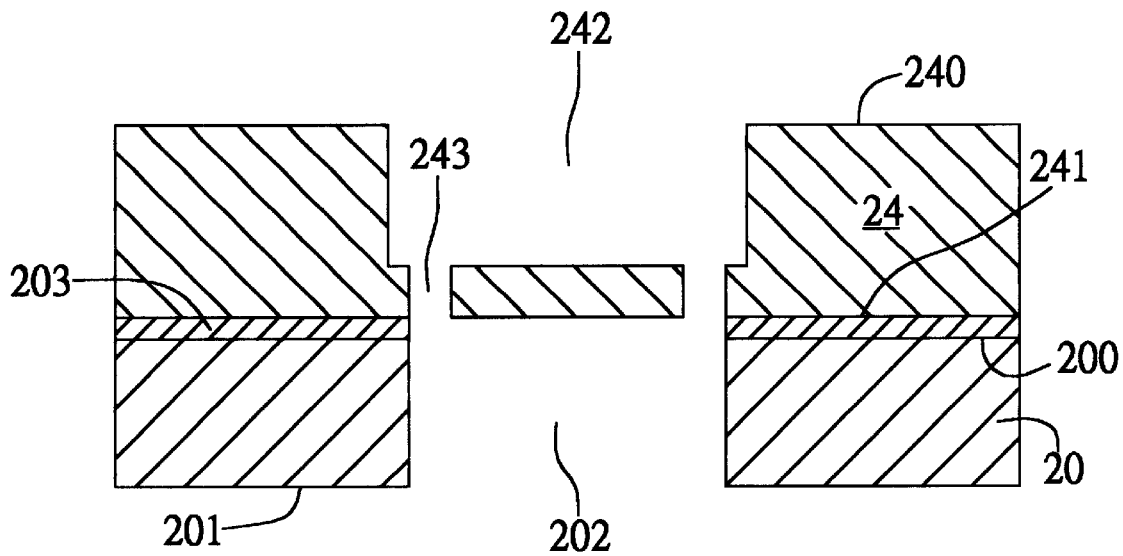
FIGS. 4A–4F are schematic diagrams illustrating processes for fabricating a semiconductor package of a first preferred embodiment of the invention.

Referring first to FIG. 4A, a chip carrier 20 having a front surface 200 and an opposing back surface 201 is provided, which is formed at a central position with at least one opening 202 for receiving a semiconductor chip (not shown) therein The back surface 201 of the chip carrier 20 is disposed with a plurality of conductive traces (not shown) and bonding pads (not shown) thereon, whereas the front surface 200 of the chip carrier 20 is attached to a bottom surface of a heat dissipating structure 24 by means of an adhesive layer 203. The chip carrier 20 can be a substrate made of BT (bismaleimide-triazine) resin, epoxy resin, polyimide resin, triazine resin or ceramics, or a TAB (tape automated bonding) tape, wherein a BT resin substrate and a TAB tape are more preferable.

Figure 4B:
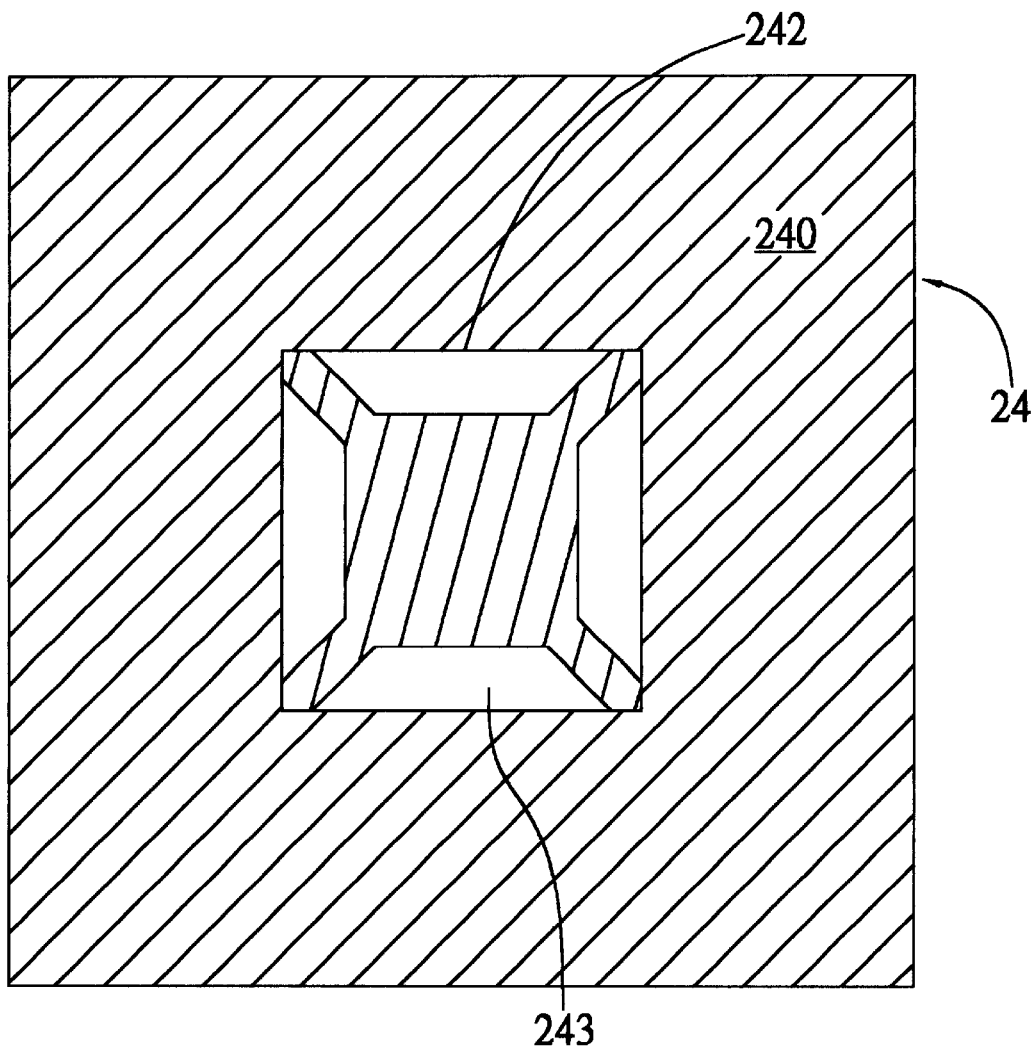

Referring to FIGS. 4A and 4B, the heat dissipating structure 24 having a top surface 240 and an opposing bottom surface 241 is made of a metallic material such as copper and aluminum. A chip receiving cavity 242 for receiving a semiconductor chip (not shown) therein, is formed by conventional stamping means at the top surface 240 of the heat dissipating structure 24 corresponding in position above the opening 202 of the chip carrier 20. A plurality of through holes 243 are drilled at the bottom of the chip receiving cavity 242, allowing gold wires (not shown) and an encapsulating resin (not shown) to pass through the through holes 243. After the heat dissipating structure 24 is attached to the chip carrier 20, it is ready to perform a chip bonding process.

Figure 4C:
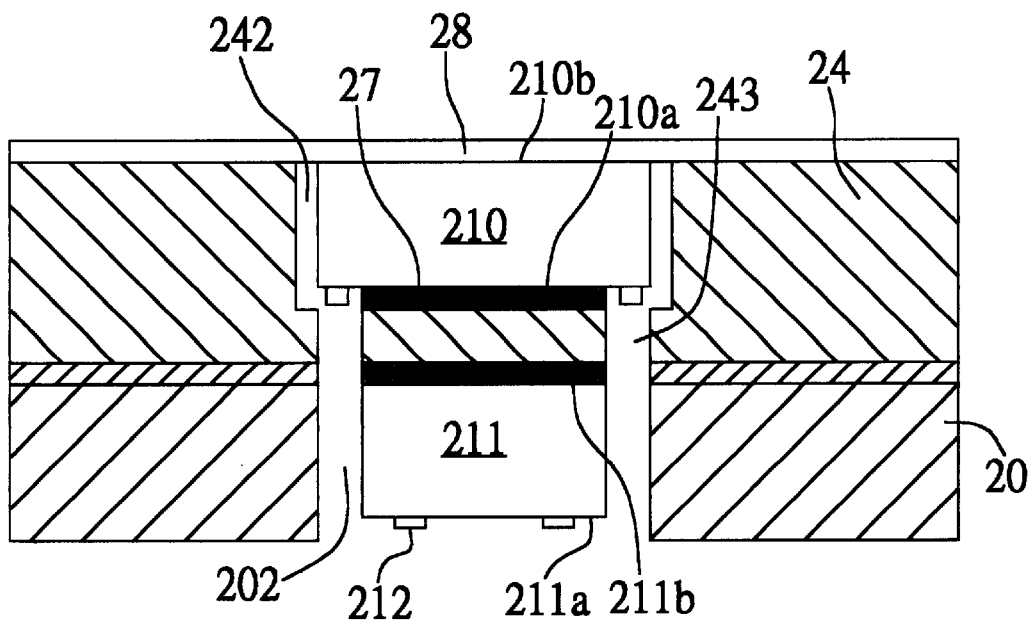

Referring to FIG. 4C, a first semiconductor chip 210 has an active surface 210a disposed with a plurality of electronic circuits and electronic elements, and an opposing non-active surface 210b; similarly, a second semiconductor chip 211 also has an active surface 211a and an opposing non-active surface 211b. A plurality of I/O (input/output) bonding pads 212 are formed on the active surfaces 210a, 211a of the chips 210, 211. The first and second chips 210, 211 are deposited onto the heat dissipating structure 24 in the chip receiving cavity 242 and the opening 202 of the chip carrier 20 respectively by means of an adhesive 27 such as silver paste, with the active surfaces 210a, 211a thereof facing downwardly; that is, the semiconductor structure of the invention is fabricated in a cavity down manner. This allows the bonding pads 212 on the active surface 210a of the first chip 210 to be exposed to the through holes 243 on the bottom of the chip receiving cavity 242. After the chip bonding and curing processes are completed, a covering sheet 28 is adhered onto the non-active surface 210b of the first chip 210 so as to prevent an encapsulating resin from flashing over the non-active surface 210b in a subsequent molding process. However, if the first chip 210 is entirely embedded in the chip receiving cavity 242, its non-active surface 210b would be covered by the encapsulating resin (not shown) and thus is not necessarily attached with the covering sheet 28.

Figure 4D:
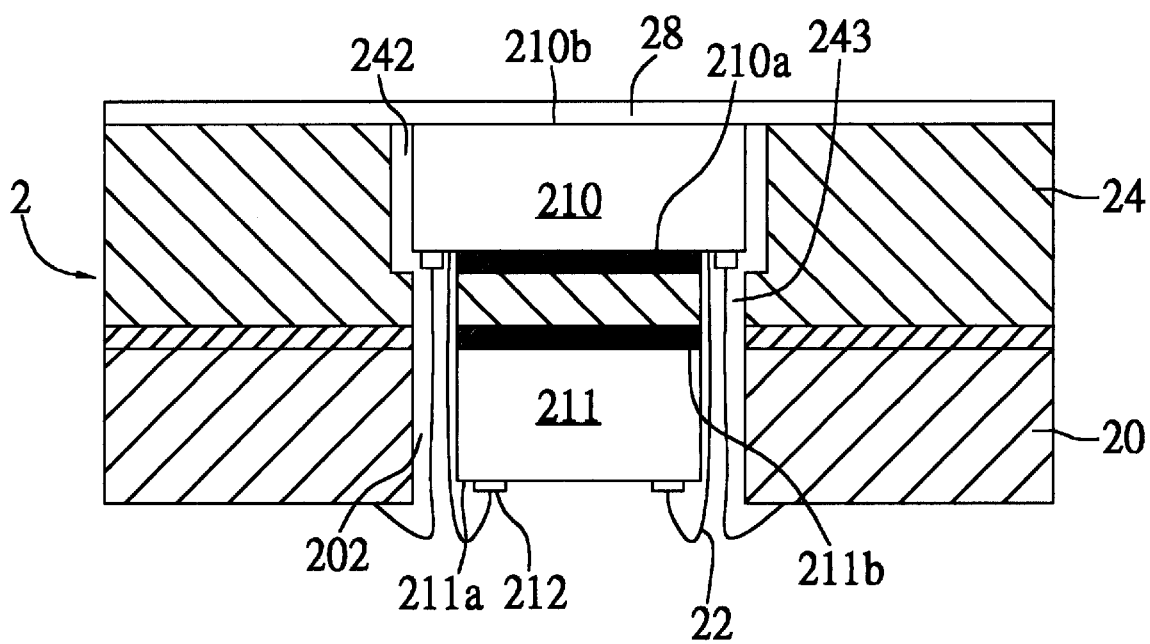

Referring FIG. 4D, after the chip bonding process is completed, firstly, the active surface 211a of the second chip 211 is electrically connected to the active surface 210a of the first chip 210 by a plurality of gold wires 22; then, the bonding pads 212 of the first chip 210, that are exposed to the through holes 243 of the heat dissipating structure 24, are electrically coupled to the chip carrier 20 also by the gold wires 22. Alternatively, the first and second chips 210, 211 can be electrically connected to the chip carrier 20 respectively by the gold wires 22, as shown in FIGS. 5A and 5B. Thereafter, a molten encapsulating resin (not show) is applied for forming an encapsulant (designated by a reference numeral 23 in FIG. 4E) and enclosing the first and second chips 210, 211 and the gold wires 22 in the encapsulant 23. Therefore, the first and second chips 210, 211 respectively disposed in the chip receiving cavity 242 and the opening 202 of the chip carrier 20, are interconnected via the through holes 243, that are used as passages for the gold wires 22 and the encapsulating resin (not shown) to pass therethrough; this effectively shortens the connecting distance between the first chip 210 and the second chip 211. Such an arrangement is beneficial as to reduce wire loop length and electric inductance interference, and also to significantly save fabrication costs without using the costly flip-chip technology.

Figure 4E:
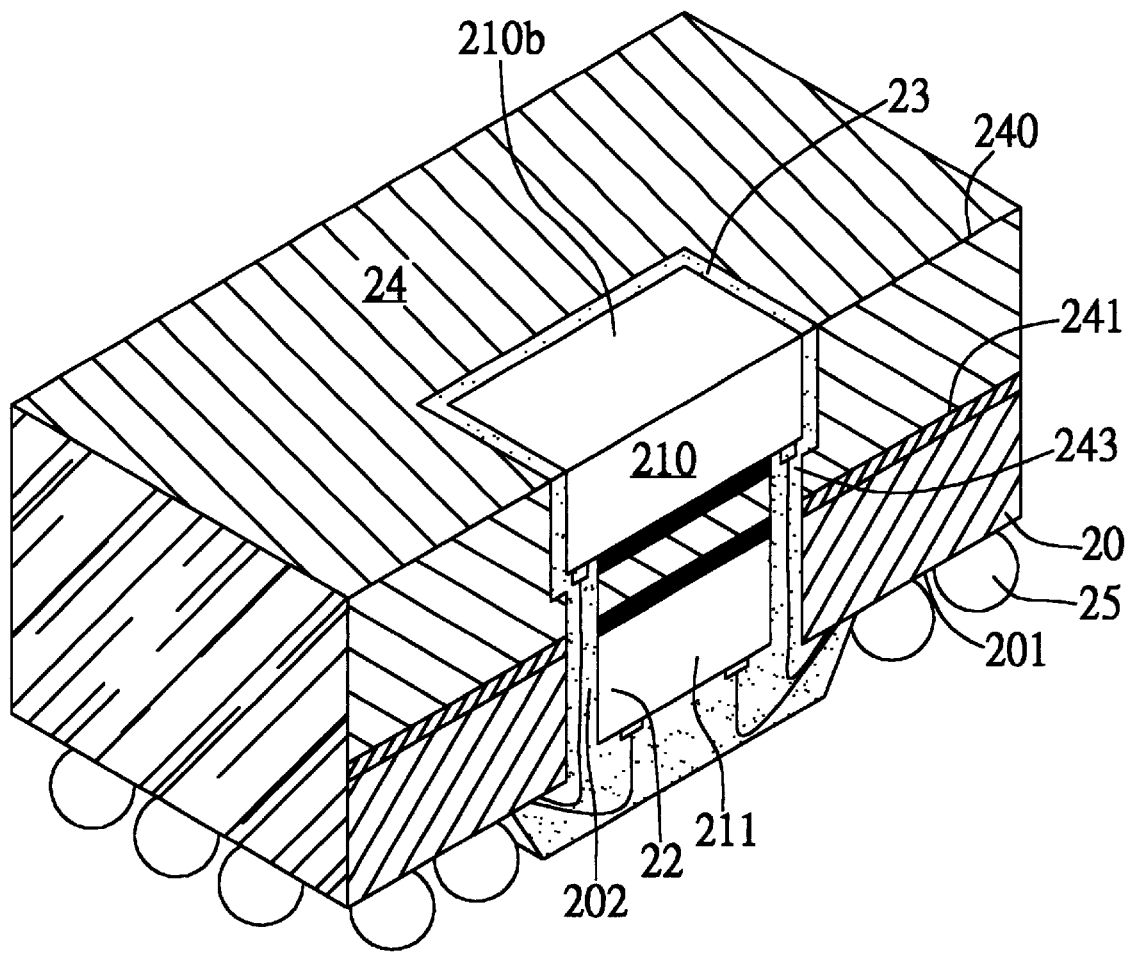
Figure 4F:
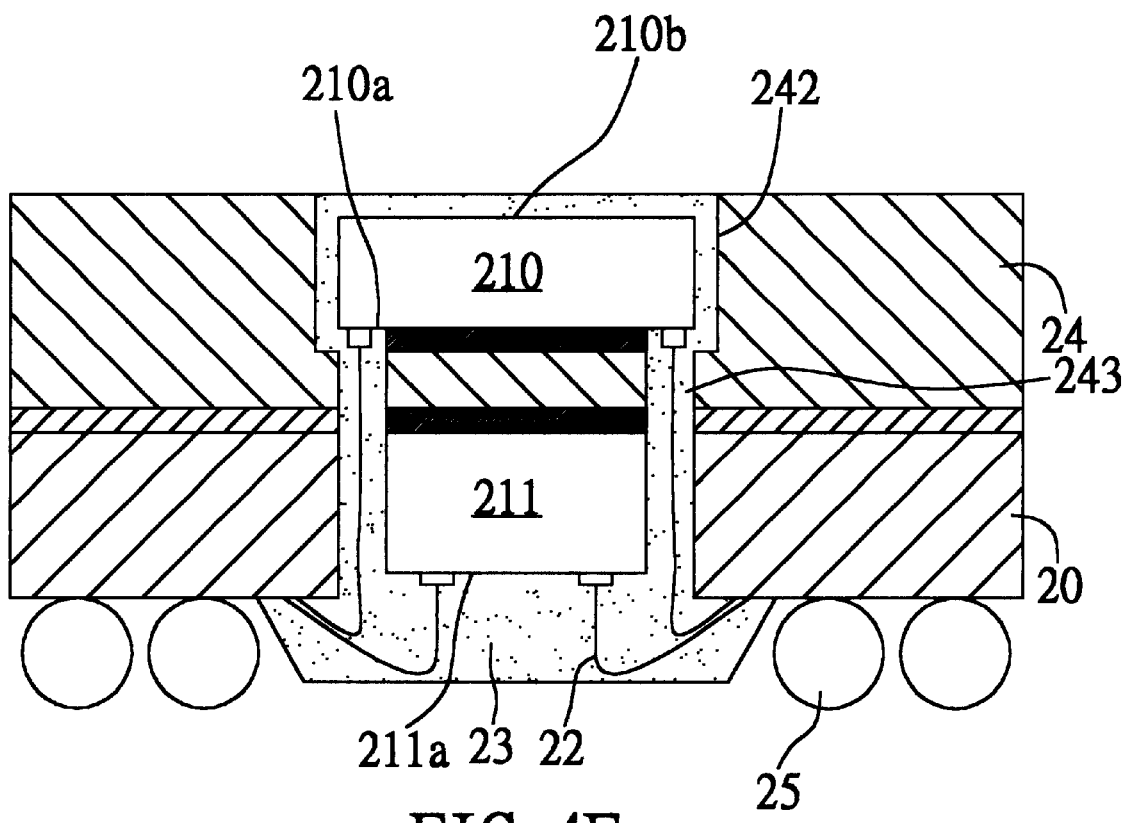
Figure 5A:
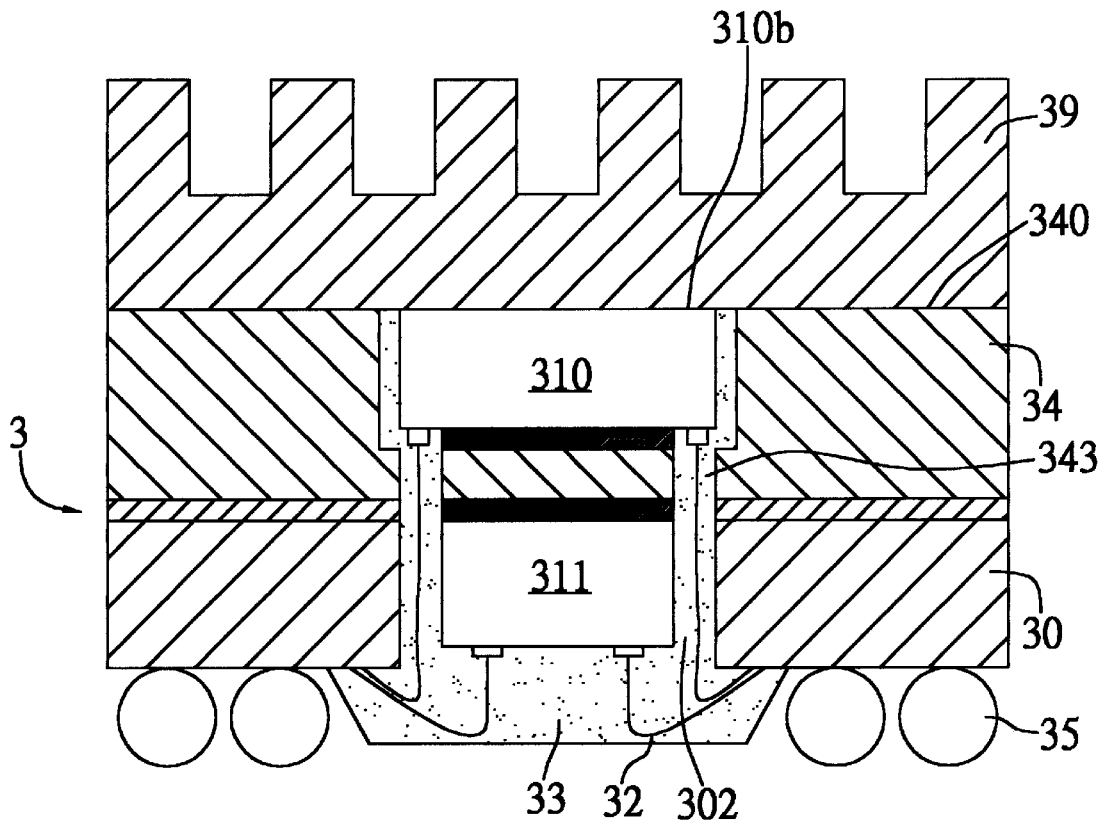
FIGS. 5A and 5B are cross-sectional views of a semiconductor package of a second preferred embodiment of the invention.
Figure 5B:
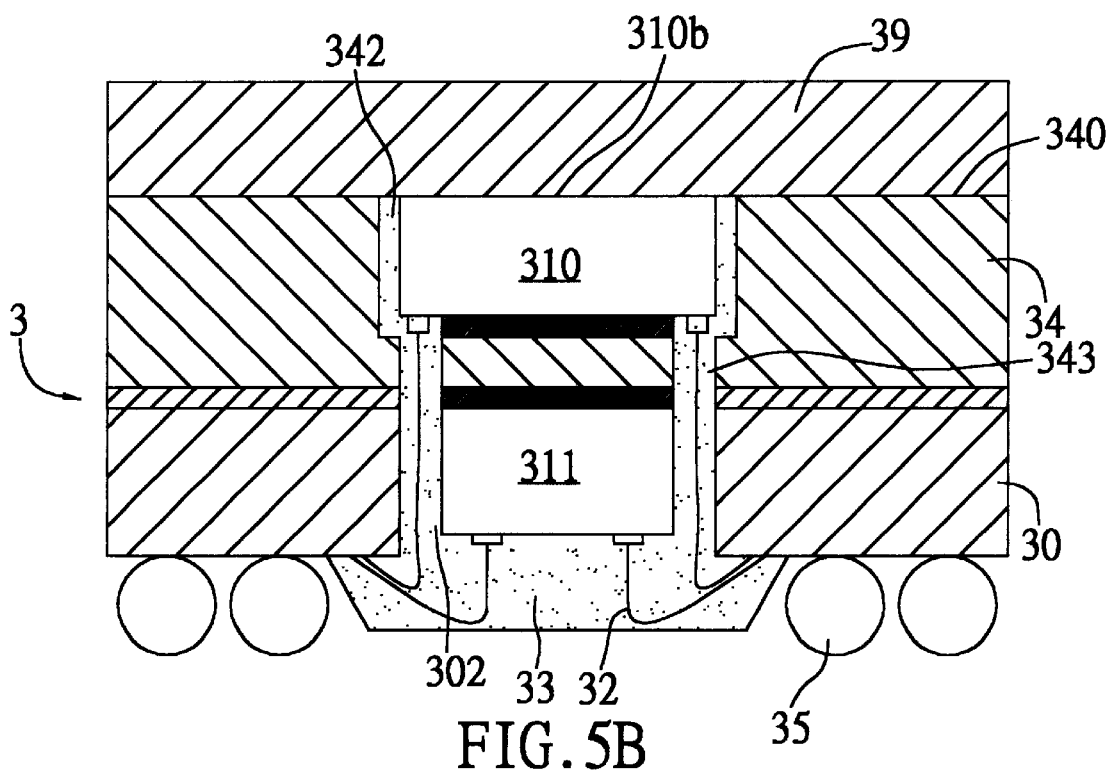

Referring to FIG. 4E, after the encapsulant 23 is completely formed, the covering sheet 28 attached on the non-active surface 210b of the first chip 210 is removed, so as to expose the non-active surface 210b to outside of the encapsulant 23. Alternatively, as shown in FIG. 4F, the first chip 210 can be entirely embedded in the chip receiving cavity 242 with its non-active surface 210b being directly covered by the encapsulant 23. Finally, a plurality of solder balls 25 are implanted onto the back surface 201 of the chip carrier 20 for allowing the semiconductor package 2 to be electrically connected to an external device; this completes the dual-chip semiconductor package 2 of the first embodiment of the invention. In conclusion, since the chips of the invention are disposed in direct contact with the heat dissipating structure, heat produced in operation of the chips can be directly and rapidly dissipated by the heat dissipating structure; this therefore remarkably enhances heat dissipating efficiency of the semiconductor package. Moreover, the chips received in the chip receiving cavity and the opening of the chip carrier allow the structural arrangement to be optimized in compactness, thereby effectively reducing overall dimensions of the fabricated packaging product, which is favorable in compliance with profile miniaturization of electronic product development.

Second Preferred Embodiment

FIGS. 5A and 5B illustrate a second preferred embodiment of a semiconductor package of the invention. As shown in the drawings, the semiconductor package 3 of the second embodiment is structurally identical to that of the first embodiment, but only differs with the provision of an external hear sink 39 adhered onto the semiconductor package 3. This is accomplished in a manner that, after an encapsulant 33 is formed and a covering sheet (not shown) is removed from a non-active surface 310b of a first chip 310, the external hear sink 39 is attached to a top surface 340 of a heat dissipating structure 34 by means of a heat dissipating adhesive (not shown). The external heat sink 39 can further enhance the heat dissipation through the heat dissipating structure 34, so as to accelerate the removal of heat generated by semiconductor chips 310, 311. This is therefore preferably applicable to a more highly integrated or multi-chip semiconductor package in facility of improved heat dissipation efficiency.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A multi-chip semiconductor package with a heat dissipating structure, comprising:

a chip carrier having at least one opening thereon;

a heat dissipating structure attached onto the chip carrier for covering the opening of the chip carrier, wherein the heat dissipating structure is formed with an outwardly-opened cavity corresponding in position above the opening of the chip carrier, and a plurality of through portions for interconnecting the cavity and the opening of the chip carrier;

at least one first chip having an active surface and an opposing non-active surface, and received in the cavity with the active surface thereof being attached to the cavity;

at least one second chip having an active surface and an opposing non-active surface, and received in the opening of the chip carrier with the non-active surface thereof being attached to the heat dissipating structure;

a plurality of conductive elements passing through the through portions, for electrically connecting at least one of the chips to the chip carrier; and an encapsulant for encapsulating the first chip, the second chip and the conductive elements.

2. The multi-chip semiconductor package of claim 1, wherein the semiconductor package is a cavity down BGA (ball grid array) package.

3. The multi-chip semiconductor package of claim 1, wherein the chip carrier is a substrate made of a material selected from a group consisting of BT (bismaleimide-triazine) resin, epoxy resin, polyimide resin, triazine resin and ceramics.

4. The multi-chip semiconductor package of claim 1, wherein the chip carrier is a TAB (tape automated bonding) tape.

5. The multi-chip semiconductor package of claim 1, wherein the opening of the chip carrier is used for receiving the second chip therein.

6. The multi-chip semiconductor package of claim 1, wherein the cavity is a chip receiving cavity for receiving the first chip therein.

7. The multi-chip semiconductor package of claim 1, wherein the non-active surface of the first chip is exposed to outside of the encapsulant.

8. The multi-chip semiconductor package of claim 1, wherein the first chip is completely embedded in the cavity.

9. The multi-chip semiconductor package of claim 1, wherein the through portions are through holes.

10. The multi-chip semiconductor package of claim 1, wherein the active surface of the first chip is formed with a plurality of bonding pads thereon, and the bonding pads are exposed to the through portions.

11. The multi-chip semiconductor package of claim 1, wherein the conductive elements are gold wires.

12. The multi-chip semiconductor package of claim 1, wherein the heat dissipating structure is mounted with an external heat sink thereon.

* * * * *